United States Patent [19]

Layh

[11] Patent Number: 4,789,778

[45] Date of Patent: Dec. 6, 1988

[54] TWO TERMINAL LIGHT BARRIER SYSTEM

[76] Inventor: Hans-Dieter Layh, Zachersweg 17, D-7121 Gemmrigheim, Fed. Rep. of Germany

[21] Appl. No.: 61,496

[22] Filed: Jun. 15, 1987

[30] Foreign Application Priority Data

Jun. 13, 1986 [DE] Fed. Rep. of Germany ....... 3620012

[51] Int. Cl.$^4$ ............................................. G01V 9/04
[52] U.S. Cl. ..................................... 250/221; 340/556
[58] Field of Search .................. 250/221, 222.1, 222.2; 340/555, 556, 557

[56] References Cited

U.S. PATENT DOCUMENTS

| | | | |
|---|---|---|---|
| 2,777,934 | 1/1957 | Falkenthal | 340/556 |
| 3,083,966 | 4/1963 | Untiedt | 340/556 |
| 3,714,644 | 1/1973 | Hellstrom | 340/556 |
| 3,946,241 | 3/1976 | Malinowski | 250/221 |
| 4,012,635 | 3/1977 | Walter et al. | 250/221 |
| 4,268,823 | 5/1981 | Rauchut et al. | 340/555 |
| 4,546,345 | 10/1985 | Naito | 340/555 |

*Primary Examiner*—David C. Nelms
*Assistant Examiner*—Michael Messinger
*Attorney, Agent, or Firm*—Barnes & Thornburg

[57] ABSTRACT

A light barrier system having a two-terminal network that is connected in series with a precision resistor. In normal operation, in this two-terminal system, two different potential drops occur, according to whether the light path between the light-emitting and the light-receiving elements of the light barrier arrangement is interrupted or not. Correspondingly, one input of a monitoring circuit is located at two different levels. In the event of a breakage of the supply lines or a short circuit of the light barrier system, the input is located at an extremely high or extremely low level.

5 Claims, 2 Drawing Sheets

TWO TERMINAL LIGHT BARRIER SYSTEM

BACKGROUND AND SUMMARY OF THE INVENTION

The present invention relates to a light barrier system, particularly for automatic doors, having an electric light emitter arrangement as well as an electric light receiver arrangement that interacts with the light emitter arrangement and generates an electric signal when the light path of the light barrier is interrupted or cleared.

For automatic doors, as a rule, several light barrier arrangements are provided in order to, on the one hand, be able to monitor the area directly in the plane of the door opening and, on the other hand, also monitor the areas in front of and behind this plane. The light barrier arrangements are combined with electronic control systems which actuate the door drive or the door drives as a function of whether one light barrier or several light barriers are interrupted or not.

In known light barrier systems, in addition to the lines for the electrical power supply, separate control lines are also required for each light barrier arrangement, so that as a rule, four connections exist for each light barrier arrangement.

This makes the cabling problematic, particularly when many light barrier arrangements are provided at one door. Also, it is disadvantageous that the miniaturization of electronic control systems that is theoretically possible cannot be carried out or are difficult to be carried out because of the many required cable connections. This is particularly true when the light barrier systems must also be able to be checked with respect to short circuits and/or line breakages, because for this purpose, the number of connections per light barrier arrangement that is high in any event, up to now, had to be increased even more.

It is therefore an objective of the present invention to provide a light barrier system that, despite only minimal expenditures for the cabling, can be monitored with respect to short-circuits as well as line breakages.

This and other objectives is achieved in the present invention by providing a radiant energy barrier system having a radiant energy receiver and a radiant energy emitter, in which an electric signal is generated when an energy path between the emitter and receiver is interrupted or cleared, with a two-terminal network. The system includes a power source for providing power to the system, at least one power supply line connecting the source to the system. The emitter and receiver are interconnected in the network. The network has a potential difference between the two terminals that are connected to the power source that is changed by the interruption or clearing of the energy path. A monitoring means reacts to the potential difference and is connected away from the barrier system at the power supply line.

The invention is therefore based on the general idea of developing the radiant energy barrier arrangement as an active or passive two-terminal network that, in the case of an undisturbed operation, switches over between two conditions that are characterized by a different potential drop or by different potential differences at the two-terminal network. One of the different potential drops (or differences) occurs when the light path is cleared and the other occurs when the light path is interrupted. Should a potential drop or difference occur that deviates from the two values that are characteristic of a normal operation, a system disturbance must exist, such as a short circuit or a line breakage.

A special advantage of the invention is the fact that the potential drop or electric quantities that are associated with it can very easily be tapped away from the light barrier arrangement at one or both power supply lines of the light barrier system. Accordingly, the light barrier system according to the invention requires only two electric power supply lines, but no additional control or monitoring lines with assigned cables. Even one single supply line per light barrier arrangement may also be sufficient if, for example, for the zero potential, a collective connection is used for all external apparatuses and/or light barrier systems of one door control system or the like.

According to a particularly preferred embodiment of the invention, it is provided that the two-terminal network is connected in series with at least one precision resistor arranged in a supply line and the monitoring circuit is connected with an input between the resistor and the two-terminal network.

In this particularly preferred embodiment, the monitoring circuit can evaluate the potential drop at the precision resistor or the electric level as the input signal. When the operation of the light barrier arrangement is undisturbed, only two values for the potential drop or level can occur, whereas in the case of a line breakage or of a short circuit, an extremely low or an extremely high potential drop or extremely high or extremely low levels are measured.

In a manner that is particularly simple with respect to circuit technology in certain preferred embodiments, the two-terminal network with a potential drop or difference that changes according to the condition of the light path of the light barrier, may be implemented by using a digital output of a circuit part that is arranged as a part of the network, which when the light path is cleared or interrupted, is located at different voltage levels. One terminal of the two-terminal network, via a resistor, is connected with this output. In order to be able to differentiate between the conditions of the light path, each light barrier arrangement basically requires one circuit part, the output of which, in a corresponding way, alternates between two conditions. According to the present invention, it is therefore sufficient to connect this type of output with one terminal, i.e., with one supply line of the two-terminal network formed by the light barrier arrangement, via a resistor.

Other objects, advantages and novel features of the present invention will become apparent from the following detailed description of the invention when considered in conjunction with the accompanying drawings.

DETAILED DESCRIPTION OF THE DRAWINGS

Figure 1:
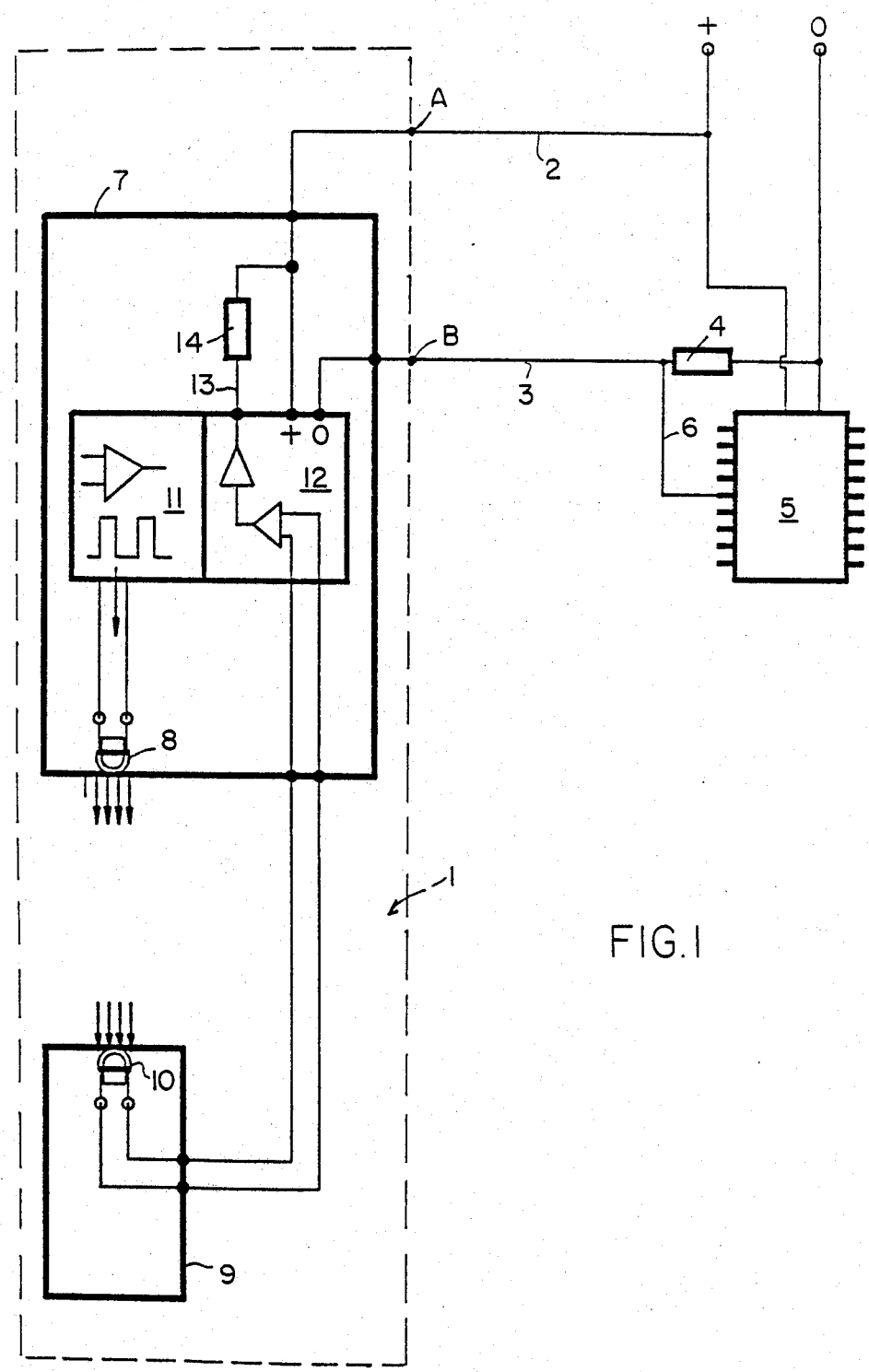
FIG. 1 is a circuit diagram of a light barrier arrangement constructed in accordance with a particularly preferred embodiment of the present invention.

The light barrier arrangement that as a whole has the reference number 1 forms a two-terminal network that at A and B is connected with an electric power source that is not shown via power supply lines 2 and 3. In one supply line 3, a precision resistor 4 is arranged that is correspondingly connected in series with the light barrier system 1.

A monitoring circuit 5 that is, for example, formed by a conventional microcomputer, is connected for its electric power supply, with the same current source as the light barrier system 1. An input 6 of the monitoring circuit 5 is connected to the power supply line 3 between the precision resistor 4 and the light barrier arrangement 1 such that the monitoring circuit 5, in a manner that is described below, is able to evaluate different voltage levels between the precision resistor 4 and the light barrier system 1.

The light barrier system 1 has a first housing 7 for a light-emitting element 8 and a second housing 9 for a light-receiving element 10. The two housings 7 and 9 and the two elements 8 and 10 are arranged opposite one another in such a way that light emitted by element 8, in a known way, impinges on element 10, as long as the light path is clear between the two elements 8 and 10; i.e., as long as no persons or objects are in the light path.

The housing 7 houses all circuit blocks that are connected with the power supply lines 2 and 3, for example, blocks 11 and 12. The circuit block 11 drives the light-emitting element 8 that correspondingly emits, for example, pulse-code modulated light signals. Circuit block 12 analyzes the signals of the light-receiving element 10 which is electrically connected with the input side of the circuit block 12. As a function of whether the light-receiving element 10 is reached by the light of the light-emitting element 8 or not, the circuit block 12 places a digital output 13 of an amplifying circuit contained in circuit block 12 at a high level (such as 1) or at a low level (such as 0). The "+" and "o" connections to circuit block 12 are connections for supplying power to circuit blocks 11 and 12.

The output 13, via a resistor 14, is connected with one supply line 2, in other words, with one terminal A of the two-terminal network formed by the light barrier system 1.

Figure 2:
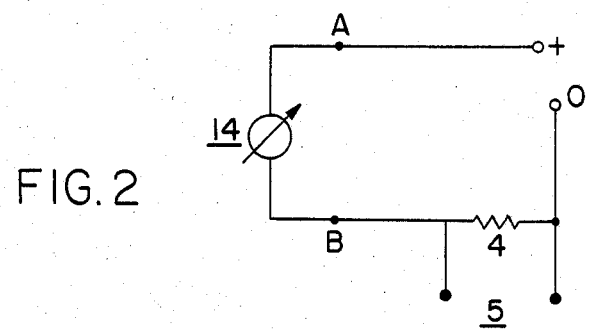
FIG. 2 is a schematic diagram of a portion of the circuit of FIG. 1.

The shown arrangement operates as follows:

During the operation of the light barrier system 1, the output 13 of the circuit block 12 is switched either to a high or to a low level, depending on whether the light path between elements 8 and 10 is clear or interrupted. Corresponding to the different levels, the resistor 14 is impressed by a different current, with the result that at the two-terminal network formed by the light barrier system 1; in other words, at points A and B, a different potential drop will occur. Reference may be had to the schematic drawing of FIG. 2 for ease of understanding. This has the result that also at the precision resistor 4, a different potential drop will occur, because the sum of the potential drops at the precision resistor 4 and at the two-terminal network formed by the light barrier system 1 must be essentially constant and corresponds to the terminal voltage of the power source. As a result, however, the input 6 of the monitoring circuit 5 is also necessarily located at two different voltage levels, according to whether the light path between elements 8 and 10 is clear or interrupted.

Thus, when the operation of the light barrier system 1 is undisturbed, the monitoring circuit 5 at the input 6 registers only two different electric levels. Should, on the other hand, a short circuit exist in the light barrier system 1, practically no potential drop could occur at the two-terminal network formed by the light barrier system 1. This has the result that practically the whole terminal voltage of the power source drops at the precision resistor 4. Thus, the input 6 of the monitoring circuit 5 is at a level that in the shown circuit embodiment corresponds to the level of the electrically positive terminal of the power supply line.

On the other hand, in the case of a breakage of the supply lines 2 or 3, the electric connection between the input 6 and the electrically positive terminal of the power supply system is interrupted, with the result that the input 6 is connected with the zero potential of the other terminal of the power source. In this case therefore, the input 6, in the shown embodiment, is located at the level 0.

Summarizing, it should be pointed out that the input 6, when the light barrier system operates correctly, may be located only at two different "mean" levels, while in the case of a short circuit or a line breakage, an extremely high or an extremely low level exists. It is contemplated that levels may also occur that are characteristic and can be differentiated from the "mean" levels, if a short circuit or a line breakage occur in individual circuit parts; for example, in the light-receiving element 10 and circuit parts that interact with it. In this respect, power-consuming elements or circuit parts are basically preferred because then a line breakage will always result in a change of the potential drop between points A and B and thus in a change of the level at input 6. For this reason, a power consuming means, such as a photo-resistor is preferably arranged as the light-receiving element.

In a contemplated embodiment (not shown), the precision resistor 4 may also be arranged in supply line 2. In this case, the input 6 would then be connected to the supply line 2 between the light barrier system 1 and the precision resistor 4. However, the operating method stays basically the same. In contrast to the shown circuit, the input 6 in the case of a short circuit would only be located on the zero potential and in the case of a breakage of the lines 2 or 3, on the potential of the positive terminal of the current supply system.

In addition, in certain further contemplated embodiments, the light-receiving element 10 is housed in the housing 7 and the light path between element 8 and 10 extends via a mirror means arranged in place of the housing 9, this mirror means reflecting the light coming from element 8 into element 10.

Figure 3:
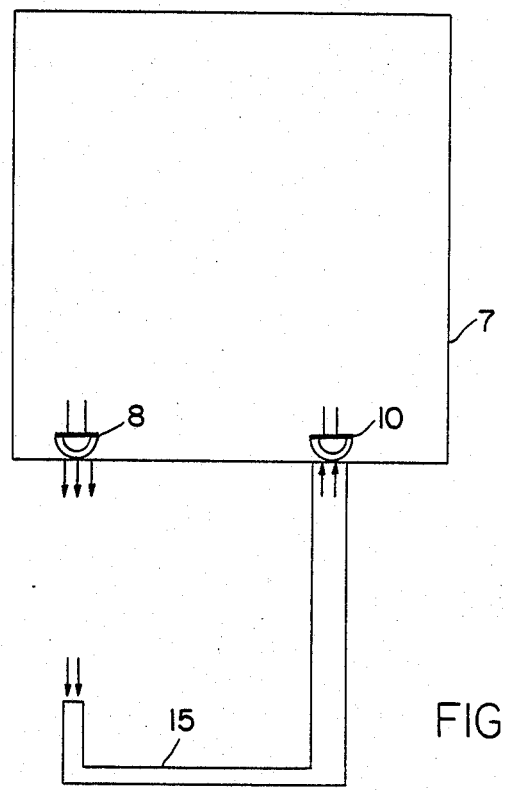
FIG. 3 is a block diagram of an alternate embodiment of the arrangement of the emitter and receiver of the present invention.

Instead of the arrangement of a mirror, in certain preferred embodiments, optical fiber bunching 15 is used, one end of which is arranged in place of the housing 9 and receives the light coming from element 8, as seen in FIG. 3. This light is guided along correspondingly by the light conducting fibers. At the other end of the optical fibers 15 is element 10 on which the light will then impinge. This element 10 can also then be arranged in the housing 7, because the optical fiber bunching is arranged correspondingly.

Although termed a light barrier, the present invention is not limited to systems that operate with visible light. Elements 8 and 10 may also be provided for invisible light in the infrared and ultra-violet range. In addition, the elements 8 and 10, instead of light, in contemplated embodiments will also emit and receive electromagnetic rays, such as radar rays, or also sound radiation, for example, ultra-sound radiation. The term "light" in this application therefore has a comprehensive meaning. In addition to the protection for light barriers, protection is also claimed for corresponding radar barriers, ultra-sound barriers or the like.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. A radiant energy barrier system, particularly for automatic doors, having radiant energy emitter means as well as radiant energy receiver means that interacts with said radiant energy emitter means and generates an electric signal when an energy path between said emitter means and said receiver means is interrupted or cleared, comprising:

a power source for providing power to said barrier system;

a two-terminal network in which said emitter means and said receiver means are interconnected, said netewok having two terminals;

an output circuit means in said two-terminal network having an input connected to said receiver means and an output connected by a series resistor to one of said two terminals, said output circuit means producing an output at different voltage levels in response to said energy path being interrupted or cleared to changing the potential difference between said two terminals;

a first and second power supply line connecting said power source to said two terminals of said two-terminal network;

a precision resistor connected in series with said first power supply line remote from said two-terminal network; and monitoring means for sensing a voltage drop across said precision resistor as an indication of the potential difference between said two terminals.

2. A radiant energy barrier system according to claim 1, wherein said output is a digital output.

3. A radiant energy barrier system according to claim 2, wherein said two-terminal network includes a control circuit for said emitting means; said output circuit means being an amplifying circuit for said receiving means; said system further comprising a joint housing for housing said control circuit, said amplifying circuit and at least one of said emitting means and said receiving means.

4. A radiant energy barrier system according to claim 2, further comprising optical fibers for receiving radiant energy from said emitter means, wherein both said emitter means and said receiver means are arranged in said joint housing, and said energy path is between said emitter means and said optical fibers, said optical fibers being connected to said receiver means.

5. A radiant energy barrier system according to claim 1, wherein said radiant energy is light.

* * * * *